United States Patent
Chen et al.

(10) Patent No.: US 6,360,756 B1
(45) Date of Patent: Mar. 26, 2002

(54) WAFER RINSE TANK FOR METAL ETCHING AND METHOD FOR USING

(75) Inventors: Chie-Chi Chen, Chu Tung Town; Tzu-Yang Chung, Ping-Tung Gey; Szu-Yao Wang; Sheng-Liang Pan, both of Hsin-Chu, all of (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 09/325,307

(22) Filed: Jun. 3, 1999

(51) Int. Cl.⁷ .................................................. B08B 7/04
(52) U.S. Cl. .................. 134/95.3; 134/95.1; 134/102.1; 134/902
(58) Field of Search ................................ 134/902, 95.1, 134/95.3, 102.1, 102.2, 186, 182

(56) References Cited

U.S. PATENT DOCUMENTS

| | | | | |
|---|---|---|---|---|
| 5,069,235 A | * | 12/1991 | Vetter et al. | 134/186 X |
| 5,540,247 A | * | 7/1996 | Kawatani et al. | 134/182 |
| 5,913,981 A | * | 6/1999 | Florez | 134/902 X |
| 5,950,645 A | * | 9/1999 | Olesen et al. | 134/186 X |
| 6,159,303 A | * | 12/2000 | Nadahara et al. | 134/182 X |

* cited by examiner

Primary Examiner—Philip Coe
(74) Attorney, Agent, or Firm—Tung & Associates

(57) ABSTRACT

A rinse tank for rinsing electronic substrates after a chemical process and a method for utilizing such rinse tank are provided. In the rinse tank, devices for performing a quick dump rinse; for performing a cascade overflow rinse and for feeding an inert gas bubbling are provided in the cavity of a single rinse tank. By utilizing the present invention novel rinse tank, the processing problems frequently observed in conventional rinse tanks where two rinse tanks are required for the quick dump rinse and for the cascade overflow rinse, such as particle re-deposition and a large floor space area requirement are eliminated. Furthermore, the wafer rinse process after a metal etching process can be accomplished in a total process time that is at least 2~3 minutes shorter than that required by using conventional rinse tanks.

7 Claims, 2 Drawing Sheets

WAFER RINSE TANK FOR METAL ETCHING AND METHOD FOR USING

FIELD OF THE INVENTION

The present invention generally relates to a rinse tank for electronic substrates and a method for using such tank and more particularly, relates to a wafer rinse tank for rinsing semiconductor wafers after a metal etching process with deionized water and a method for using such rinse tank.

BACKGROUND OF THE INVENTION

In the manufacture of semiconductor devices, a large quantity of deionized (DI) water is required to process integrated circuit wafers. The consumption of DI water increases with the size of the wafers. For instance, the consumption at least doubles in the processing of 200 mm size wafers when compared to the consumption in the processing of 150 mm size wafers. DI water is most frequently used in tanks and scrubbers for the frequent cleaning and rinsing of wafers in process. It is desirable that the surface of a wafer be cleaned by DI water after any process has been conducted on the wafer, i.e., oxide deposition, nitride deposition, SOG deposition or any other deposition or etching process. Such wafer cleaning step is accomplished by equipment that are installed either in-line or in a batch-type process.

For instance, a cassette-to-cassette wafer scrubbing system is one of the most used production systems for wafer cleaning prior to either a photoresist coating, oxidation, diffusion, metalization or CVD process. A typical automated wafer scrubber combines brush and solution scrubbing by DI water. The scrubber utilizes a hyperbolic high pressure spray of DI water with a retractable cleaning brush. A typical mechanical scrubbing process consists of rotating a brush near a wafer surface that is sprayed with a jet of high pressure DI water at a pressure between about 2,000 and about 3,000 psi. The brush does not actually contact the wafer surface, instead, an aquaplane is formed across the wafer surface which transfers momentum to the DI water. The movement of the DI water thus displaces and dislodges contaminating particles that have been deposited on the wafer surface. Contaminating particles are thus removed by a momentum transfer process. As a result, larger particles become more difficult to dislodge and remove from a wafer surface.

A typical wafer scrubbing process consists of a DI water spray step followed by a spin dry and nitrogen gas blow dry step. In a typical wafer scrubbing equipment, production rates are generally between 60 to 120 wafers per hour depending on the program length. The spinning speed of the wafer is between 500 to 10,000 rpm while under a water pressure of up to 6,000 psi.

In more recently developed wafer scrubbing systems, in-line systems are used which provide high pressure DI water scrubbing only while eliminating the possibility of wafer contamination by overloaded brushes. The water pressure in these systems range between 3,000 to 6,000 psi which are ejected from a nozzle mounted on an oscillating head. The wafer is spun when the oscillating spray is directed onto the wafer surface. After the cleaning step, wafer is dried by a pure nitrogen gas purge to promote rapid drying. After the scrubbing operation, wafers can be loaded into an in-line dehydration baking system for thorough drying. Batch-type systems are also used with DI water for cleaning, rinsing and drying prior to many IC processes. The systems can be programmed wherein wafers are loaded in cassettes before each cycle. One disadvantage of the batch system is their inability to be integrated into part of an automated wafer processing line.

In the conventional DI water cleaning systems, the basic requirements for the DI water cleaning system are that it provides a continuous supply of ultra-clean water with very low ionic content. It is believed that ionic contaminants in water, such as sodium, iron or copper when deposited onto a wafer surface can cause device degradation or failure. It is therefore desirable to eliminate all such ionic content from a DI water prior to using the water for cleaning wafers. A conventional method of measuring the ionic content in DI water is by monitoring the water resistivity. A water resistivity of $18 \times 10^6$ Ohm-cm or higher indicates a low ionic content in the DI water. In a conventional water purifying system, several sections which include charcoal filters, electrodialysis units and a number of resin units to demineralize the water are used for purifying the water.

Deionized water is frequently used in a wet bench process after a metal etching process has been conducted on a semiconductor wafer. When residual etchant chemical must be removed, deionized water rinse is frequently used in a wet bench process for semiconductor wafer processing in performing two major functions of a quick dump rinse (QDR) and a cascade overflow rinse. Conventionally, the two functions are carried out in separate tanks in order to produce the desirable. Major processing issues presented by the conventional dual-tank process are the particle re-deposition problem during a withdrawal step when cassettes are transported from a quick dump rinse tank to a cascade overflow tank. A second major issue is the large floor space required for accommodating two tanks.

It is therefore an object of the present invention to provide a rinse tank for rinsing electronic substrates after a chemical process that does not have the drawbacks or shortcomings of conventional rinse tanks.

It is another object of the present invention to provide a rinse tank for rinsing electronic substrates after a chemical etching process that allows three independent rinsing operations to be performed in the same tank.

It is a further object of the present invention to provide a rinse tank for rinsing electronic substrates after a chemical process that can be used in carrying out a quick dump rinse, a cascade overflow rinse and an inert gas bubbling rinse in the same tank.

It is another further object of the present invention to provide a rinse tank for rinsing electronic substrates after a chemical process that is equipped with a cavity adapted for holding means for a quick dump rinse, for a cascade overflow rinse and for an inert gas bubbling rinse in the same tank.

It is still another object of the present invention to provide a method for rinsing a substrate after an etching process which includes the steps of performing a cascade overflow rinse on a plurality of substrates while bubbling an inert gas through deionized water used for the rinse, and then performing a quick dump rinse on the plurality of substrates in the same rinse tank.

It is yet another object of the present invention to provide a method for rinsing a substrate after a metal etching process by first positioning at least one substrate cassette in a cavity of a rinse tank, and then performing a cascade overflow rinse, an inert gas bubbling rinse and a quick dump rinse on the plurality of substrates in the same cavity.

It is still another further object of the present invention to provide a wafer rinse tank for rinsing electronic wafers after a metal etching process which includes means for conducting a cascade overflow rinse, means for bubbling an inert gas through a rinse solution, and means for conducting a quick dump rinse on the plurality of wafers in the same rinse tank.

It is yet another further object of the present invention to provide a wafer rinse tank for rinsing semiconductor wafers after a metal etching process which includes a cavity i n the wafer rinse tank equipped for holding at least one wafer cassette filled with a plurality of wafers, means for conducting a cascade overflow rinse, means for bubbling a nitrogen gas through a rinse solution, and means for conducting a quick dump rinse on the plurality of wafers.

SUMMARY OF THE INVENTION

In accordance with the present invention, a rinse tank combining functions of quick dump rinse, cascade overflow and nitrogen bubbling simultaneously for rinsing electronic substrates after a chemical process and a method for using such rinse tank are disclosed.

In a preferred embodiment, a rinse tank for rinsing electronic substrates after a chemical process is provided which includes device for performing a quick dump rinse, device for performing a cascade overflow rinse and a device for inert gas bubbling.

The rinse tank for rinsing electronic substrates may further include a spray device for spraying deionized water on the electronic substrates. The device for performing quick dump rinse may further include means for spraying deionized water and means for draining deionized water. The insert gas bubbling device may further include a nitrogen gas bubbling device. The device for performing quick dump rinse, the device for performing cascade overflow rinse and the device for inert gas bubbling may be mounted in a cavity of a single rinse tank.

The present invention is further directed to a method for rinsing a substrate after an etching process which may be carried out by the operating steps of first providing a rinse tank that has a cavity contained therein, then positioning at least one cassette filled with a plurality of electronic substrates in the cavity, then performing a cascade overflow rinse on the plurality of substrates with deionized water while simultaneously bubbling an inert gas through the deionized water, and performing a quick dump rinse on the plurality of substrates.

The method for rinsing a substrate after an etching process may further include the step of spraying deionized water on the plurality of substrates between the cascade overflow rinse and the quick dump rinse. The step of spraying deionized water on the plurality of substrates may be carried out for at least one minute. The method may further include the step of positioning a wafer cassette filled with a plurality of wafers in the cavity. The method may further include the step of performing the cascade overflow rinse on the plurality of substrates with deionized water for at least one minute, and preferably for at least one and half minutes. The method may further include the step of performing the cascade overflow rinse process while simultaneously bubbling $N_2$ through the deionized water. The method may further include the step of performing the quick dump rinse for at least one cycle, and preferably for at least two cycles. The method may further include the step of draining the deionized water from the rinse tank between the cascade overflow rinse step and the water spraying step.

In an alternate embodiment, a wafer rinse tank for rinsing wafers after a metal etching process can be provided which includes a cavity in the wafer rinse tank adapted for holding at least one wafer cassette filled with a plurality of wafers, means for conducting a cascade overflow rinse with deionized water on the plurality of wafers, means for bubbling an inert gas through the deionized water, and means for conducting a quick dump rinse on the plurality of wafers.

The wafer rinse tank for rinsing wafers after a metal etching process may further include means for spraying deionized water on the plurality of wafers between the cascade overflow rinse step and the quick dump rinse step. The means for bubbling an inert gas may be an $N_2$ delivery tube equipped with a multiplicity of gas inlet.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a rinse tank combining quick dump rinse, cascade overflow and nitrogen bubbling simultaneously for rinsing electronic substrates after a chemical process and a method for utilizing such rinse tank. The rinse tank is equipped with a device for performing a quick dump rinse, a device for performing a cascade overflow rinse and a device for bubbling in the same tank cavity. When compared to a conventional system for rinsing electronic substrates, wherein quick dump rinse and cascade overflow rinse are conducted in separate tanks, the present invention novel rinse tank not only eliminates the chances of particle re-deposition, but also saves floor space by utilizing a single tank.

The present invention provides a single tank that combines the functions of a quick dump rinse, a cascade overflow rinse and a nitrogen bubbling simultaneously through a programmable deionized water supply software control. The present invention novel tank therefore provides a particle re-deposition free and low floor space requirement apparatus for rinsing a semiconductor wafer that has been chemically processed, such as after a metal etching process. The functions of a quick dump rinse and a cascade overflow rinse are combined in a single tank, such that the floor space required for two tanks are greatly reduced. Nitrogen, or any other inert gas, bubbling through the deionized water during the cascade overflow process removes metallic sidewall polymer deposited. The total process time for the present invention wet bench process is at least 2~3 minutes shorter than the conventional process in which separate rinse tanks are required for the quick dump rinse process and the cascade overflow rinse process.

The major benefits achieved by the present invention novel rinse tank that accomplishes a quick dump rinse process and a cascade overflow rinse process during a water rinse procedure in a single tank eliminates the particle re-deposition problem. The present invention novel single rinse tank further requires a smaller floor space requirement for a wet bench water rinse procedure. The bubbling effect of an inert gas such as nitrogen removes metallic sidewall polymer from a semiconductor wafer during the cascade overflow rinse step. The multiple function tank for executing the quick dump rinse, the cascade overflow and $N_2$ bubbling functions simultaneously can be used by utilizing a programmable deionized water supply software control during a metal photoresist wet stripping process. Simultaneously with the cascade overflow rinse step, a nitrogen bubbling process is used to vigorously agitate the deionized water such that metallic sidewall polymer may be removed from the wafers.

Figure 1:
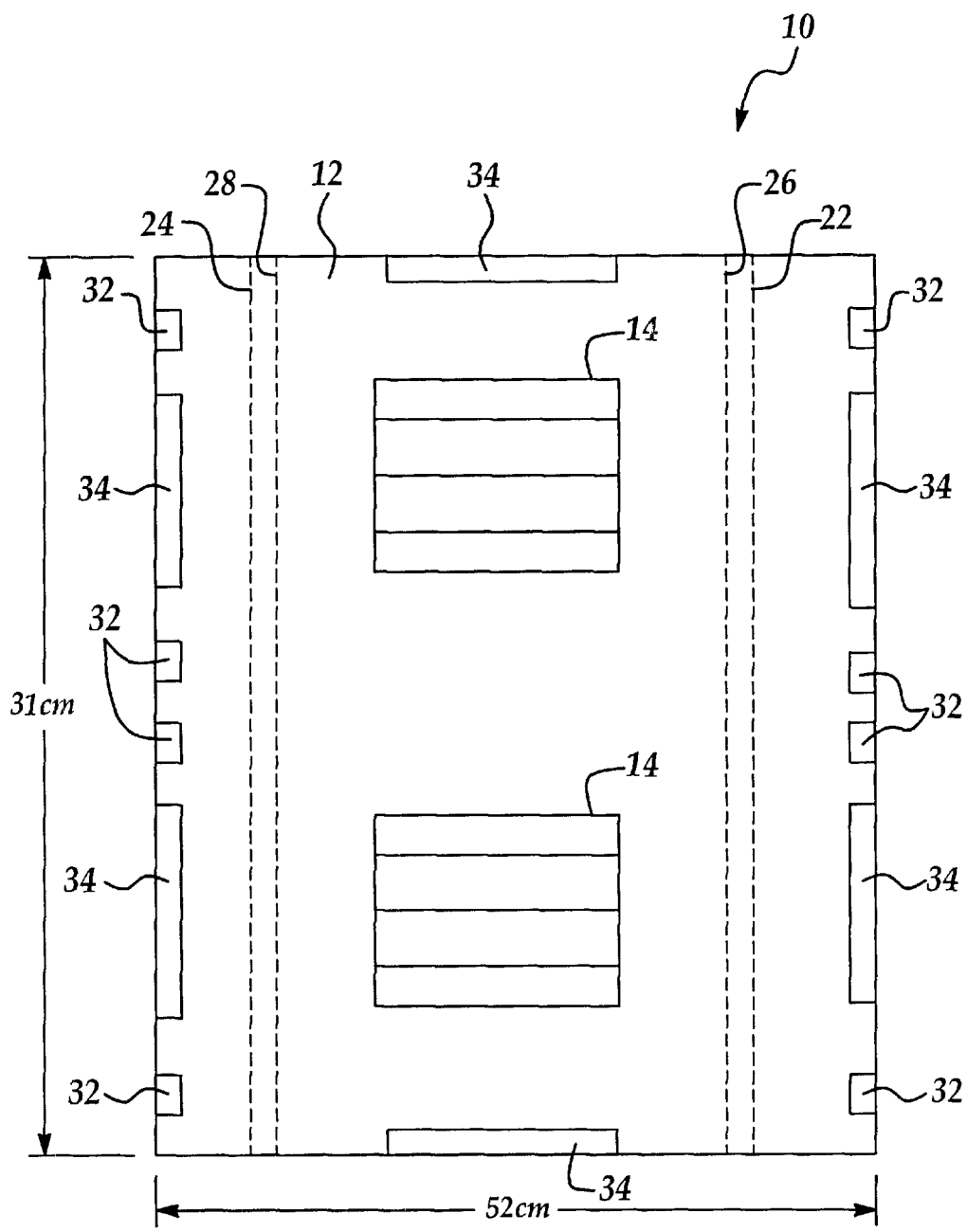
FIG. 1 is a plane view of a present invention wafer rinse tank illustrating the various components in the tank.

Referring initially to FIG. 1, a plane view of the present invention novel apparatus 10 is shown. In the single rinse tank 10, a cavity 12 is provided for accommodating at least one cassette 14 which holds a plurality of electronic substrates (not shown). In rinse tank 10, at least two deionized water supply lines 22, 24 and at least two inert gas supply lines 26, 28 are provided. A more detailed view of the water supply lines 22, 24 and the inert gas supply lines 26, 28 are shown in FIG. 2.

In the single rinse tank 10, a plurality of water spray nozzles 32 are further provided. The water spray nozzles 32 are utilized for spraying a high pressure jet of deionized water onto the plurality of semiconductor wafers (not shown) positioned in the wafer cassettes 14. The water spray step 52 for the removal of chemicals is further shown in FIG. 3. The present invention rinse tank 10 is still further provided with a plurality of water exits 34 which are used to drain water during the cascade overflow process and to allow control of the water level in the tank cavity 12 such that water does not overflow from tank 10. Typical dimensions used for the present invention rinse tank 10 are approximately 52 cm×31 cm, as shown in FIG. 1. However, any other suitable size of the tank 10 may also be used. For instance, when more than two wafer cassettes 14 are to be accommodated in the cavity 12, tank 10 should be made sufficiently large to accommodate the cassettes.

Figure 2:
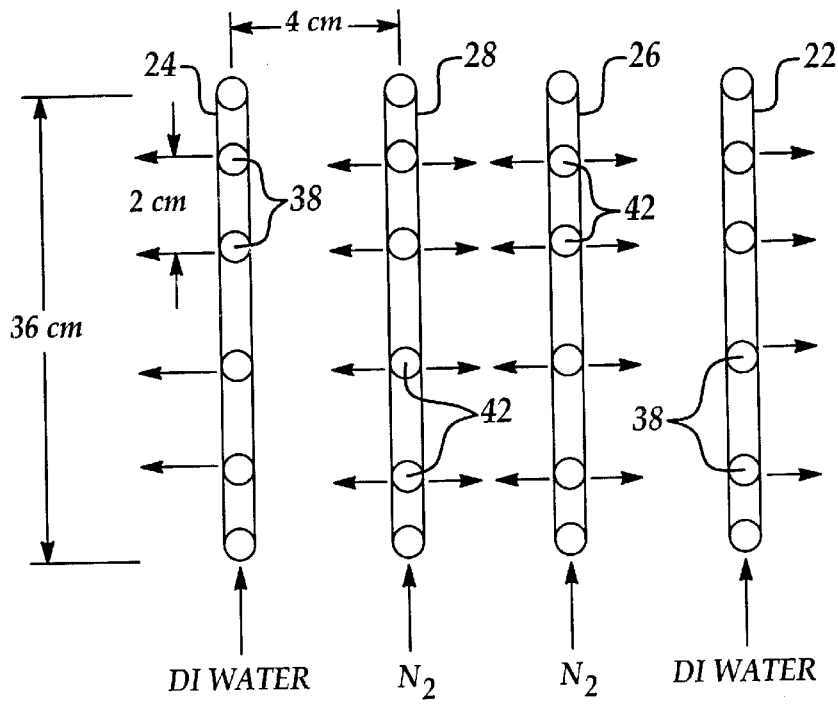
FIG. 2 is a schematic illustrating a plane view of the deionized water outlets and the bubbling gas inlets.

FIG. 2 is a schematic of the water supply pipes 22, 24, and inert gas supply pipes 26, 28. It is seen that the deionized water supply pipes are provided at a distance of approximately 4 cm from the inert gas supply pipe 28. The deionized water supply pipes 22, 24 are further provided with a plurality of water exits 38 which are directed in a direction that is parallel with a bottom .surface (not shown) of tank 10. A suitable distance between two adjacent water exits 38 is approximately 2 cm. Further away from the sidewalk of the tank 10, a pair of inert gas supply pipes 26, 28 are provided. Each of the supply pipes 26, 28 are provided with a plurality of inert gas outlets 42 for directing an inert gas into the deionized water that the pipes 26, 28 are immersed in. The diameter of the water supply pipes 22, 24 and of the gas supply pipes 26, 28 are suitably selected to allow sufficient volume of water or gas to enter into the cavity 12 of the tank 10. These pipes should be fabricated of a suitable material that is non-corrosive in their service environment and be substantially inert such that no chemical reaction occurs between the pipe material and the cleaning solvent they are immersed in and thus preventing the generation of contaminating particles. Suitable materials such as stainless steel, Teflon, and any other materials that has sufficient rigidity and strength may also be used.

Figure 3:
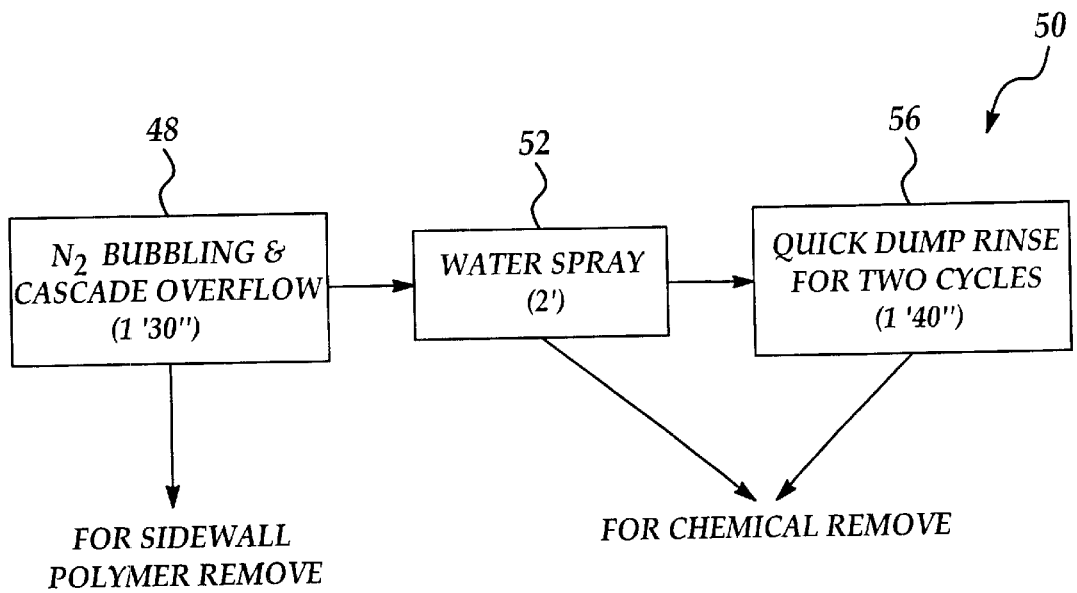
FIG. 3 is a process flow diagram illustrating the present invention single rinse tank process.

A process flow diagram of the present invention novel method for cleaning a semiconductor wafer after a metal etching process for photoresist removal is shown in FIG. 3. The process flow diagram 50 consists of three major steps of step 48, step 52 and step 56. In the first cleaning step, utilized mainly for sidewall polymer removal, a cascade overflow rinse process with deionized water and a nitrogen bubbling process are conducted simultaneously in the tank cavity 12. A suitable time period for conducting the cleaning process is at least 1 minute, and preferably about 1½ minute. After the first step 48 is carried out, deionized water is sprayed from the water spray nozzles 32 onto the plurality of semiconductor wafers (not shown) stored in the wafer cassettes 14. This is shown in step 52. The water spraying process can be carried out for a time period of at least 1 minute, and preferably for at least 2 minutes. In the final step of the rinse process conducted in the same rinse tank 10, a quick dump rinse is carried out for at least 1 cycle, and preferably for at least 2 cycles. This is shown in step 56 for a time period of at least 1 minute, and preferably for approximately 1 minute 40 seconds. The second step 52 and the third step 56 conducted in the same rinse tank 10 are mainly used for removing chemicals on the semiconductor wafers. In a quick dump rinse process, the deionized water in the cavity 12 of the tank is quickly drained away and the tank is refilled with clean deionized water for the second quick dump rinse cycle.

The total cleaning process utilizing the present invention novel rinse tank only requires approximately 5 minutes and 10 seconds which is at least between 2 and 3 minutes shorter than that required in a conventional rinse process. The present invention novel rinse tank and the method for utilizing such tank result in significant time savings in a semiconductor fabrication process.

The present invention novel apparatus and method have therefore been amply described in the above descriptions and in the appended drawings of FIGS. 1–3.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A rinse tank for rinsing substrates after a chemical process comprising:
    device for performing a quick dump rinse including at least two spaced-apart water supply pipes each having a plurality of water exits for directing water in a direction away from the center of the tank and parallel to a bottom surface of the tank; and
    device for performing a cascade overflow rinse including at least two spaced-apart inert gas supply pipes each having a plurality of inert gas outlets for directing an inert gas into the water.

2. A rinse tank for rinsing substrates after a chemical process according to claim 1 further comprising a spray device for spraying deionized water.

3. A rinse tank for rinsing substrates after a chemical process according to claim 1 further comprising means for holding a least one wafer cassette.

4. A rinse tank for rinsing substrates after a chemical process according to claim 1, wherein said device for performing quick dump rinse further comprises means for spraying deionized water and means for draining deionized water.

5. A rinse tank for rinsing substrates after a chemical process according to claim 1, wherein said device for performing quick dump rinse, said device for performing cascade overflow rinse and said device for inert gas bubbling are mounted in the cavity of a single rinse tank.

6. A wafer rinse tank for rinsing wafers after a metal etching process comprising:

a cavity in said wafer rinse tank adapted for holding at least one wafer cassette filled with a plurality of wafers, means for conducting a cascade overflow rinse with deionized water on said plurality of wafers, means for bubbling an inert gas through said deionized water, and means for conducting a quick dump rinse on said plurality of wafers including at least two spaced-apart water supply pipes each having a plurality of water exits for directing water in a By direction away from the center of the tank parallel to a bottom surface of the tank, including at least two spaced-apart inert gas supply pipes each having a plurality of inert gas outlets.

7. A wafer rinse tank for rinsing wafers after a metal etching process according to claim 6 further comprising means for spraying deionized water on said plurality of wafers between said cascade overflow rinse and said quick dump rinse.

* * * * *